US009159597B2

(12) United States Patent
Chang et al.

(10) Patent No.: US 9,159,597 B2
(45) Date of Patent: Oct. 13, 2015

(54) REAL-TIME CALIBRATION FOR WAFER PROCESSING CHAMBER LAMP MODULES

(75) Inventors: Chih-Tien Chang, Hsinchu (TW); Sunny Wu, Zhudong Town (TW); Jo Fei Wang, Hsin-Chu (TW); Jong-I Mou, Hsinpu Township, Hsinchu County (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 509 days.

(21) Appl. No.: 13/471,583

(22) Filed: May 15, 2012

(65) Prior Publication Data

US 2013/0306621 A1    Nov. 21, 2013

(51) Int. Cl.
| F26B 3/30 | (2006.01) |
| F27B 5/14 | (2006.01) |
| C23C 14/00 | (2006.01) |
| C23C 16/00 | (2006.01) |
| H01L 21/67 | (2006.01) |
| H05B 1/02 | (2006.01) |

(52) U.S. Cl.
CPC .... *H01L 21/67115* (2013.01); *H01L 21/67248* (2013.01); *H05B 1/0233* (2013.01)

(58) Field of Classification Search
CPC ............ F26B 19/00; F26B 3/30; F26B 13/10; F27B 5/14; F27B 14/00; C23C 14/00; C23C 16/00
USPC .......... 392/416, 418; 219/405, 411, 390, 385, 219/412, 413; 118/724, 725, 50.1
See application file for complete search history.

(56) References Cited

U.S. PATENT DOCUMENTS

| 4,956,538 | A | * | 9/1990 | Moslehi ..................... 219/121.6 |
| 5,305,417 | A | * | 4/1994 | Najm et al. .................. 392/418 |
| 5,443,315 | A | * | 8/1995 | Lee et al. ..................... 374/126 |
| 5,444,815 | A | * | 8/1995 | Lee et al. ..................... 392/416 |
| 5,970,214 | A | * | 10/1999 | Gat ................................ 392/416 |
| 6,002,109 | A | * | 12/1999 | Johnsgard et al. ............ 219/390 |
| 6,191,392 | B1 | * | 2/2001 | Hauf et al. .................... 219/411 |
| 6,262,397 | B1 | * | 7/2001 | Yazawa ......................... 219/411 |
| 6,414,280 | B1 | * | 7/2002 | Nishitani et al. .............. 219/411 |
| 6,476,362 | B1 | * | 11/2002 | Deacon et al. ................ 219/390 |
| 6,561,694 | B1 | * | 5/2003 | Lerch et al. ................... 374/126 |
| 7,833,348 | B2 | * | 11/2010 | Wada et al. ..................... 117/89 |
| 7,935,913 | B2 | * | 5/2011 | Kusuda ......................... 219/411 |
| 2003/0075274 | A1 | * | 4/2003 | Halpin et al. ............. 156/345.51 |
| 2003/0209327 | A1 | * | 11/2003 | Kuznetsov et al. ....... 156/345.52 |
| 2006/0186354 | A1 | * | 8/2006 | Kawase et al. ............. 250/492.2 |

* cited by examiner

*Primary Examiner* — Dana Ross
*Assistant Examiner* — Michael Laflame, Jr.
(74) *Attorney, Agent, or Firm* — Haynes and Boone, LLP

(57) ABSTRACT

An apparatus, a system and a method are disclosed. An exemplary apparatus includes a wafer processing chamber. The apparatus further includes radiant heating elements disposed in different zones and operable to heat different portions of a wafer located within the wafer processing chamber. The apparatus further includes sensors disposed outside the wafer processing chamber and operable to monitor energy from the radiant heating elements disposed in the different zones. The apparatus further includes a computer configured to utilize the sensors to characterize the radiant heating elements disposed in the different zones and to provide a calibration for the radiant heating elements disposed in the different zones such that a substantially uniform temperature profile is maintained across a surface of the wafer.

20 Claims, 3 Drawing Sheets

REAL-TIME CALIBRATION FOR WAFER PROCESSING CHAMBER LAMP MODULES

BACKGROUND

In some semiconductor manufacturing processes, wafer processing chambers or reactors are used to process wafers from which integrated circuits are made. During the manufacturing process, a wafer is placed on a wafer holder (or susceptor). After the wafer has been placed on the wafer holder, it is placed in a processing chamber or reactor where a high temperature process is performed using lamp modules. The lamp modules may be located in different zones over and under the wafer holder to heat the wafer holder and the wafer such that wafer processing may be performed on the wafer.

For example, wafer processing such as chemical vapor deposition (CVD), using lamp modules, may be performed to deposit or epitaxially (epi) grow film layers on the wafer. As the CVD process is carried out, the amount of film deposited on the wafer may vary as a function of the temperature profile of the wafer. The temperature profile across the wafer may not be uniform for a variety of reasons. For example, the temperature profile may not be uniform across the wafer because various lamp module's power output may deteriorate over time, thereby causing temperature differences between various areas of the wafer. As such, the uneven temperature profile results in uneven/varying film thickness and uniformity that ultimately adversely affects the performance of the integrated circuit made from the wafer. Temperature profile uniformity can also be important for other wafer processing such as rapid thermal processing (RTP), annealing, doping, etching, and other processes. Accordingly, there is a need for an improved method and device to more uniformly control wafer temperature during wafer processing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
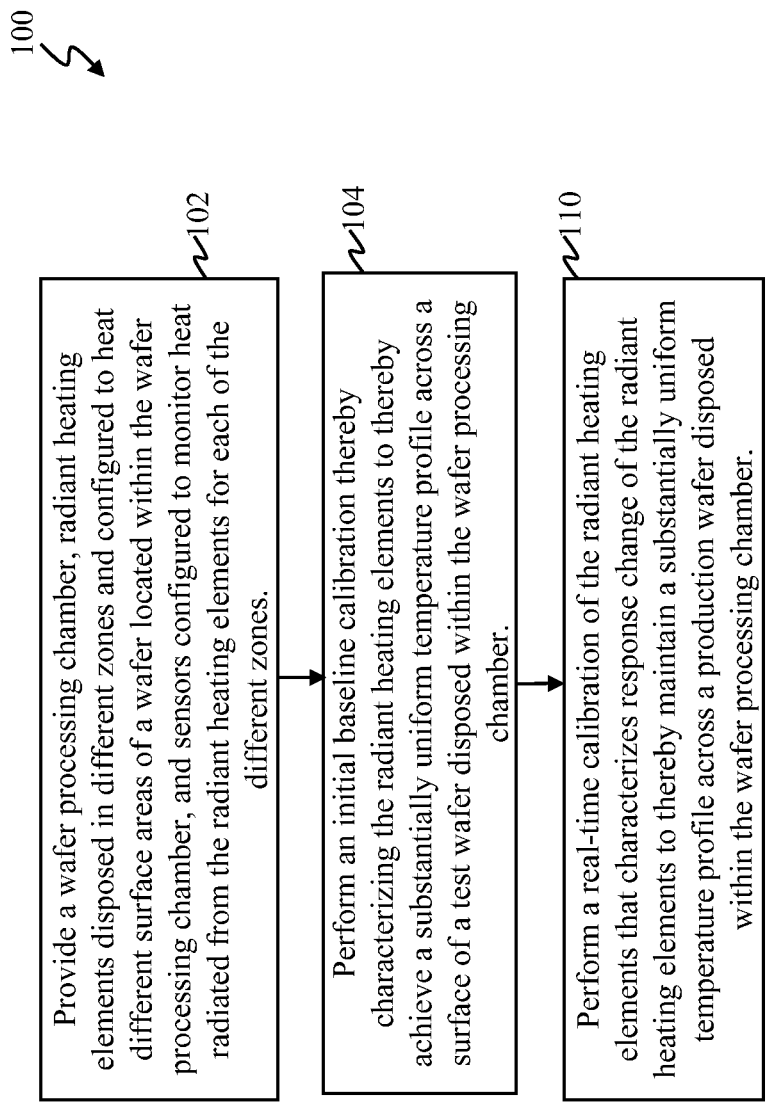
FIG. 1 illustrates a method for calibration of wafer processing apparatus lamp modules.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern semiconductor manufacturing may utilize a processing chamber or a reactor to perform high temperature wafer processing. Wafer processing such as chemical vapor deposition (CVD), rapid thermal processing (RTP), annealing, doping, etching, and other processes, rely on having uniform or even temperature profiles across the surfaces (top and bottom surface) of the wafer. As an example, in various embodiments, to provide uniform temperature profiles, after receiving new radiant heating elements or performing preventive maintenance on the radiant heating elements, calibrations of the radiant heating elements are provided. Providing the calibrations of the lamp modules may include performing wafer processing test (dummy) runs to epitaxially (epi) grow a material layer on a test wafer. Because the amount of epi grown material on the test wafer is a function of a temperature during the growth process and as such will vary according to variations in a temperature profile across the test wafer, after the material layer is epi-grown, offline monitoring, is performed to identify areas where lamp module power needs to be adjusted so that the temperature profile across the test wafer is more uniform. Offline monitoring may include measuring the material layer thickness across the test wafer surface with metrology tools to identify the areas where lamp module power need to be adjusted. Once the areas are identified, the power to the lamp modules is adjusted such that there is a uniformity in temperature across the test wafer. These steps may be repeated as necessary (usually 2-5 cycles) until it is determined that there is a relatively uniform temperature profile across the test wafer.

After adjusting the power for the lamp modules, production may proceed using the processing chamber with the calibrated or adjusted lamp modules. During production, however, lamp module response or heating efficiency may deteriorate or decay over time, thereby resulting in variation of temperature profile across a wafer. This leads to fabrication challenges.

According to various aspects of the present disclosure, calibration for processing chamber lamp modules is disclosed. The disclosed calibration method and apparatus allows for maintaining constant or uniform temperature profiles across the wafer. For example, the disclosed calibration method and apparatus allows for initially characterizing lamp modules and thereafter compensating for efficiency decay by increasing power for the lamp modules zone-by-zone, without having to take the processing chamber offline. This may be provided by either compensating while actual wafer processing is taking place or during idle periods (e.g., run-to-run). The various aspects of such a calibration method and apparatus is disclosed in more detail below.

With reference to FIG. 1, a method 100 for calibration of wafer processing apparatus lamp modules is provided. The method 100 begins at block 102 where a wafer processing chamber, radiant heating elements disposed in different zones and configured to heat different surface areas of a wafer located within the wafer processing chamber, and sensors configured to monitor heat radiated from the radiant heating elements for each of the different zones are provided. The method continues at block 104 where an initial base calibration of the radiant heating elements is performed to characterize the radiant heating elements and thereby achieve a substantially uniform temperature profile across the wafer. The method continues at block 106 where a real-time calibration of the radiant heating elements is performed to compensate for a change in performance of the radiant heating elements and thereby maintain a substantially uniform temperature profile across the wafer. In certain embodiments, the calibration may take into account other wafer processing chamber temperature profiles to provide for uniform temperature profiles across multiple wafer processing chambers. The steps of method 100 may be repeated as necessary to ensure that the temperature profile across the wafer remains uniform. It is understood that the heating process may include performing a process such as chemical vapor deposition (CVD), rapid thermal processing (RTP), annealing, etching, doping, or any other suitable wafer manufacturing process. Additional steps can be provided before, during, and after the method 100.

Figure 2:
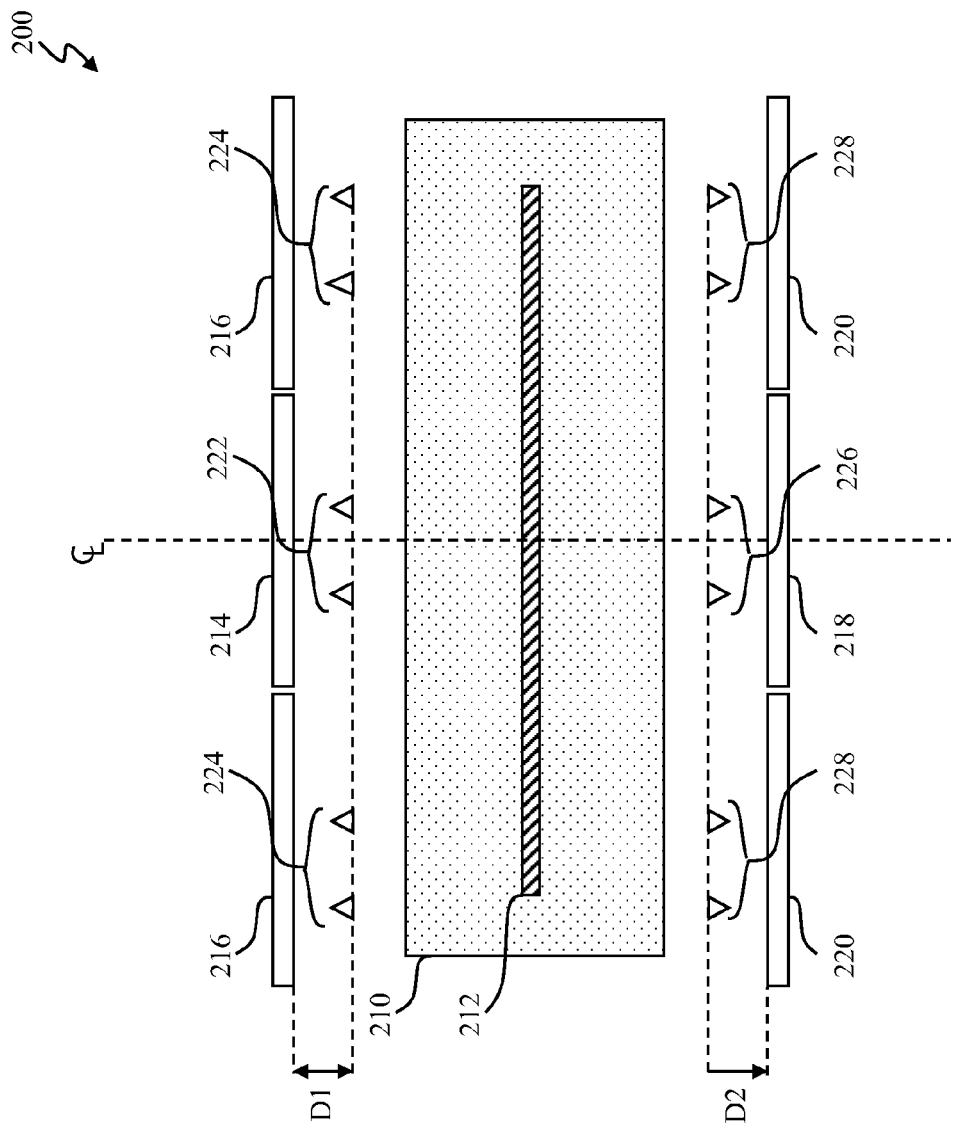
FIG. 2 illustrates a cross-sectional view of one embodiment of a wafer processing apparatus according to various aspects of the present disclosure.

With reference to FIG. 2, illustrated is a cross-sectional view of one embodiment of a wafer processing apparatus 200 according to various aspects of the present disclosure. The wafer processing apparatus 200 includes a processing chamber 210 within which a wafer 212 is processed. The processing chamber 210 may include quartz or any suitable material. The wafer 212 may include an elementary semiconductor material, such as silicon or germanium in a crystalline structure; a compound semiconductor, such as silicon germanium, silicon carbide, gallium arsenic, gallium phosphide, indium phosphide, indium arsenide, and/or indium antimonide; a combinations thereof; or any suitable material.

The wafer processing apparatus 200 further includes a center top zone 214 of radiant heat elements (which may be referred to as lamp modules) positioned above the wafer 212 in a uniform formation about the center (i.e., around center line, CL) to provide heating for a center zone of the wafer 212. The wafer processing apparatus 200 further includes an edge top zone 216 of lamp modules positioned above the wafer 212 and circumscribing the center top zone 214 lamp modules to provide heating for an edge zone of the wafer 212. The center top zone 214 and the edge top zone 216 may include any number of lamp modules according to design requirements. The lamps modules may be, for example, halogen lamps, or any suitable radiant heat elements.

The wafer processing apparatus 200 further includes a center bottom zone 218 of lamp modules positioned below the wafer 212 in a uniform formation about the center (i.e., around center line, CL) to provide heating for a center zone of the wafer 212. The wafer processing apparatus 200 further includes an edge bottom zone 220 of lamp modules positioned below the wafer 212 and circumscribing the center bottom zone 218 lamp modules to provide heating for an edge zone of the wafer 212. The center bottom zone 218 and the edge bottom zone 220 may include any number of lamp modules according to design requirements. The lamps modules may be, for example, halogen lamps, or any suitable radiant heat elements.

The wafer processing apparatus 200 further includes center top sensors 222 and edge top sensors 224. The center top sensors 222 and the edge top sensors 224 are sensors operable to sense or measure temperature or energy produced from the center top zone 214 lamp modules and from the edge top zone 216 lamp modules. The center top sensors 222 and the edge top sensor 224 may include any number of sensors positioned at any appropriate distance (D1) away from the center top zone 214 lamp modules and from the edge top zone 216 lamp modules. In the present embodiment, the center top sensors 222 and the edge top sensors 224 are positioned outside the chamber 210 and at a distance D1 of less than about 40 cm from the center top zone 214 lamp modules and from the edge top zone 216 lamp modules. Because the center top sensors 222 and the edge top sensors 224 are positioned outside the chamber 210 transient temperature variations induced by the wafer 212 are avoided. The sensors may be, for example, thermocouples or any suitable sensing elements.

The wafer processing apparatus 200 further includes center bottom sensors 226 and edge bottom sensors 228. The center bottom sensors 226 a are sensors operable to sense or measure temperature or energy produced from the lamp modules of the center bottom zone 218 and from the lamp modules of the edge bottom zone 220. The center bottom sensors 226 and the edge bottom sensors 228 may include any number of sensors positioned at any appropriate distance (D2) away from the lamp modules of the center bottom zone 218 and from the lamp modules of the edge bottom zone 220. In the present embodiment, the center bottom sensors 226 and the edge bottom sensor 228 are positioned outside the chamber 210 and at a distance D2 of less than about 40 cm from the center bottom zone 218 lamp modules and from the edge bottom zone 220 lamp modules. Because the center bottom sensors 226 and the edge bottom sensors 228 are positioned outside the chamber 210 transient temperature variations induced by the wafer 212 are avoided. The sensors may be, for example, thermocouples or any suitable sensing elements.

The wafer processing apparatus 200 may further include gas delivery mechanisms, pressure control mechanisms, vents, and any other suitable structures and mechanisms in accordance with design requirements.

Figure 3:
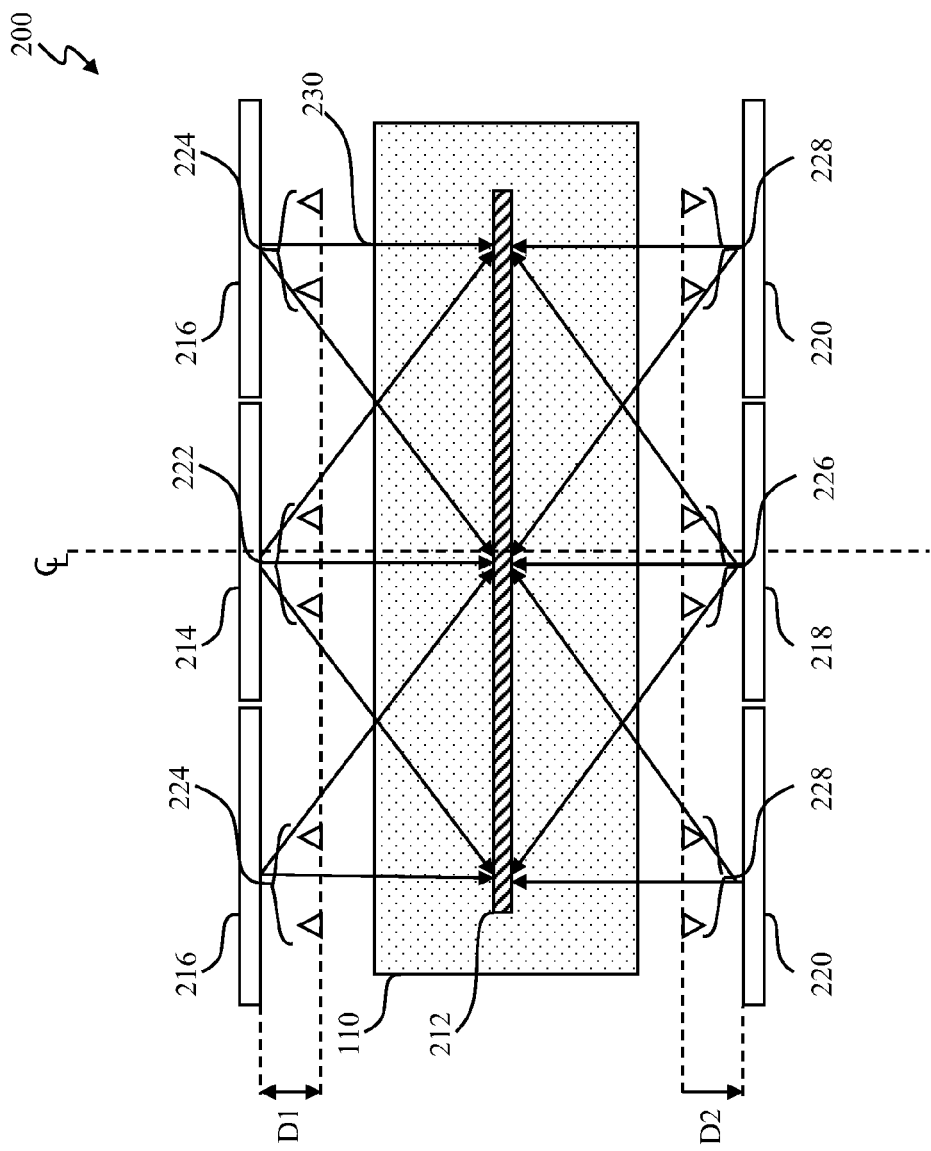
FIG. 3 illustrates a cross-sectional view of one embodiment of the wafer processing apparatus of FIG. 2, during operation, according to various aspects of the present disclosure.

Referring to FIG. 3, during operation, a wafer processing process may be employed that uses the lamp modules of the center top zone 214, the lamp modules of the edge top zone 216, the lamp modules of the center bottom zone 218, and the lamp modules of the edge bottom zone 220 to expose the wafer 212 to the radiant heat 230 and thereby heat the wafer 212. As illustrated, the radiant heat 230 from each zone interacts with the radiant heat from adjacent zones and thereby has a compound effect on the temperature profile across the wafer 212. Further, the radiant heat 230 from the top zones (i.e., 214 and 216) heats the top surface of the wafer 212 and also affects the opposing bottom surface of the wafer 212. Accordingly, the temperature profile across the wafer 212 is affected by radiant heat 230 interactions between adjacent and opposing zones.

To ensure that the lamp modules of the center top zone 214, the lamp modules of the edge top zone 216, the lamp modules of the center bottom zone 218, and the lamp modules of the edge bottom zone 220 function to produce a substantially uniform temperature profile across the wafer 212, the lamp modules for each zone are initially characterized and a base calibration is produced. As an example, the initial characterization may include performing a wafer processing process (e.g., CVD, annealing, etc. . . . ) on a test (or dummy) wafer. As the test wafer is being processed, the sensors 224 for each zone monitor the temperature radiated from the lamp modules of each zone 214, 216, 218, and 220. Based on the monitored temperature of the sensors 224, the lamp modules for each zone are characterized and a base calibration is developed. The base calibration may take any appropriate form.

The calibration for the lamp modules of each zone may take the form of a table representing the relative power percentage for the lamp modules for each zone. As an example, during the initial characterization for the base calibration it may be observed that to produce a uniform temperature profile across the wafer 212, at a target temperature of X° Celsius, the lamp modules of the center top zone 214 require 10.5% of a total power commanded, the edge top zone 216 require 59.5% of the total power commanded, the center bottom zone 218 require 12.0% of the total power commanded, and the edge bottom zone 220 require 18.0% of the total power commanded. The total power commanded is a function of the target temperature X utilized by the wafer processing being performed (e.g., CVD, RTP, annealing, etc. . . . ). The base calibration may be presented in individual calibration format, in a table format (two dimensional or three dimensional table), or any appropriate format. In an example, an individual calibration format may include providing a calibration parameter per zone (e.g., Center_Top=10.5%, Edge_Top=59.5%, Center_Bottom=12.0%, and Edge_Bottom=18.0). In another example, a table format may include a calibration table as illustrated below in TABLE 1.

TABLE 1

Percent of total power commanded per zone.

|  | Center | Edge |
|---|---|---|
| Top | 10.5% | 59.5% |
| Bottom | 12.0% | 18.0% |

As another example, a table format may include a calibration table as illustrated below in TABLE 2.

TABLE 2

Percentage power ratio of total power commanded per zone.

|  | Top to Bottom | Top Center to Edge | Bottom Center to Edge |
|---|---|---|---|
| Ratio | 70.0% | 15.0% | 40.0% |

In the embodiment of TABLE 2, for example, the Top to Bottom ratio is the top to bottom ratio of total power commanded. In other words, in the embodiment of TABLE 2, the top zones (e.g., center top and edge top) receive 70% of the total power commanded and the bottom zones (e.g., center bottom and edge bottom) receive the remaining 30%. The Top Center to Edge ratio is the center top to bottom top ratio of the 70% of total power commanded. In other words, in the embodiment of TABLE 2, the center top zone receives 70%× 15% of the total power commanded (i.e., 10.5%) and the edge top zone receives 70%×85% of the total power commanded (i.e., 59.5%). The Bottom Center to Edge ratio is the center bottom to edge bottom ratio of the 30% of the total power commanded. In other words, in the embodiment of TABLE 2, the center bottom zone receives 30%×40% of the total power commanded (i.e., 12%) and the edge bottom zone receives 30%×60% of the total power commanded (i.e., 18%).

It is understood that although in the present embodiment the base calibration parameters are represented as a form of percentages or ratios of total power commanded, the calibration parameters may be in any appropriate form or units. A 3D table representation may be used, for example, where nonlinear system response and/or interaction between various zones may require different calibration parameter values. For example, although the above calibration parameter values may produce a uniform temperature profile at a total power commanded of 2000 Watts, the above calibration parameter values may not produce a uniform temperature profile at a total power commanded of 1000 Watts due to nonlinear system response or different interactions between the different zones.

After the lamp modules for each different zone 214, 216, 218, and 220 are initially characterized and a base calibration is provided, the wafer processing apparatus 200 may be released for production. During production, over time, the response of the lamp modules of the different zones 214, 216, 218, and 220 may change. As an example, the change in response of the lamp modules of the different zones 214, 216, 218, and 220 may result from decay in lamp efficiency. The response change of the lamp modules of the different zones 214, 216, 218, and 220 will ultimately result in a non uniform temperature profile and thereby adversely affect the manufacturing process if left unchecked.

To address the response change of the lamp modules of the different zones 214, 216, 218, and 220 a real-time calibration of the lamp modules is performed to compensate for the response change of the lamp modules and thereby maintain a substantially uniform temperature profile across the wafer 212. The real-time calibration may be performed while the wafer processing apparatus 200 is in an online state. For example, while the wafer processing (e.g., CVD, RTP, annealing, etc. . . . ) that includes a heating process is being performed by the lamp modules of each of the different zones 214, 216, 218, and 220, the sensors 222, 224, 226, and 228, monitor the radiant heat 230 temperature from each of the lamp modules of each of the different zones, respectively. Based on the monitored temperature, the response change of the lamp modules of each different zone 214, 216, 218, and 220 is determined. Based on the determined response change, the lamp modules of each different zone 214, 216, 218, and 220 are calibrated in real-time to compensate for the determined response change, thereby maintaining a substantially uniform temperature profile across the wafer 212. Calibrating the lamp modules of each different zone 214, 216, 218, and 220 in real-time may include modifying the base calibration parameter values or providing an offset used to offset the base calibration parameter values. It is understood that the offset may take the form of constant values that are added to the base calibration parameter values, multiplier values that are used to ratio the base calibration parameter values, or any appropriate form.

To illustrate the real-time calibration process, the edge top zone 216 is discussed below. For example, assume that with the base calibration represented in TABLE 2, at a total power commanded of 1680.5 Watts and a zone power commanded of 1000 Watts (59.5%×1680.5 W=1000 W), the edge top zone 216 produces an initial temperature of 200° Celsius which is measured by the sensors 224. Over time, the performance of the lamp modules of the edge top zone 216 deteriorate and the lamp modules of the edge top zone 216 produce only 190° Celsius at the same zone power commanded of 1000 Watts. Based on the temperature of 190° Celsius monitored by the sensors 224, it is determined that the lamp modules of the edge top zone 216 have a response change of 5%. Based on the determined response change of 5%, the calibration of the lamp modules of the edge top zone 216 may be compensated in real-time by modifying/overriding the base calibration value with an updated calibration value of 64.5%, by adding a calibrated value of 10 Watts to the 1000 Watts, by multiplying the 1000 Watts by a calibrated value of 105%, or by any other appropriate means of compensating for the response change. In the case of modifying the base calibration parameter values, the total power actual (the sum of the zone power commanded to all of the zones) is the same as the total power commanded (i.e., both are 1680.5 Watts). In the case of adding a value of 10 Watts or multiplying by a value of 105%, the total power actual is not the same as the total power commanded (i.e., total power actual is 1690.5 Watts and total power commanded is 1680.5 Watts). Each different remaining zone 214, 218, and 220 may likewise be calibrated at the same time.

It is understood that the calibration process may account for interactions between each different zone 214, 216, 218, and 220. As such, when calibrating each different zone 214, 216, 218, and 220, it may be advantageous to account for interactions between the different zones by not compensating the base calibration by the full amount of determined response change. For example, after determining a response change for the lamp modules of the different zones 214, 216, 218, and 220 during a first wafer processing cycle, the response change for the lamp modules of the different zones 214, 216, 218, and 220 is only partially compensated, based on observed zone interactions. Thereafter, another response change for the lamp modules of the different zones 214, 216, 218, and 220 is determined during a second wafer processing cycle and only partially compensated, based on observed zone interactions. How much to partially compensate per cycle may be model or rule based and incorporated within an overall control system or algorithm, or may be based on user observation and/or judgment. This approach accounts for interactions between each different zone 214, 216, 218, and 220 and limits over compensation for the determined response change which may otherwise result.

The calibration process of method 100 may be implemented within a control system of a computer. The computer, for example, may include a central processing unit (CPU), input/output (I/O) for sending control signals to and from the wafer processing apparatus 200, storage medium such as random access memory (RAM), read only memory (ROM), FLASH memory, hard disk, compact disk (CD), or other suitable storage medium for storing software including control algorithms and calibrations utilized for controlling the lamp modules of the zones 214, 216, 218, and 220 of the wafer processing apparatus 200.

The above embodiments of method 100 and wafer processing apparatus 200 produce uniform temperature profiles across a wafer during wafer processing such as CVD, RTP, annealing, doping, etching, and other processes. For example, prior to production or after preventive maintenance, the disclosed method 100 and wafer processing apparatus 200 allow for characterization and providing a zone-by-zone base calibration of lamp modules to thereby achieve a substantially uniform temperature profile across the wafer. Further, during production, the disclosed method 100 and wafer processing apparatus 200 allow for determining efficiency decay of lamp modules and providing a real-time zone-by-zone calibration of the lamp modules, to thereby maintain a substantially uniform temperature profile across the wafer. Because the real-time calibration process allows for calibrating while the wafer processing apparatus 200 is in an online state (like during wafer processing or while idle between runs), the wafer processing apparatus 200 does not have to be taken offline to be characterized with time consuming and costly methods that utilize metrology tools. As such, the disclosed method 100 and wafer processing apparatus 200 increase wafer per hour (throughput), improve production quality and uniformity which ultimately improve device performance, and reduce cost by allowing for online real-time calibration and reduction of metrology tool loading. Different embodiments may have different advantages, and no particular advantage is necessarily required of any embodiment.

Thus, provided is an apparatus. The exemplary apparatus includes a wafer processing chamber. The apparatus further includes radiant heating elements disposed in different zones and operable to heat different portions of a wafer located within the wafer processing chamber. The apparatus further includes sensors disposed outside the wafer processing chamber and operable to monitor energy from the radiant heating elements disposed in the different zones. The apparatus further includes a computer configured to utilize the sensors to characterize the radiant heating elements disposed in the different zones and to provide a calibration for the radiant heating elements disposed in the different zones such that a substantially uniform temperature profile is maintained across a surface of the wafer.

In some embodiments, the different zones of the radiant heating elements are four different zones, and the sensors are disposed in four different zones corresponding to the four different zones of the radiant heating elements. In various embodiments, the radiant heating elements include: a first plurality of radiant heating elements disposed above the wafer in a first zone and operable to heat an inner portion of the wafer; a second plurality of radiant heating elements disposed above the wafer in a second zone and operable to heat an outer portion of the wafer; a third plurality of radiant heating elements disposed below the wafer in a third zone and operable to heat an inner portion of the wafer; and a fourth plurality of radiant heating elements disposed below the wafer in a fourth zone and operable to heat an outer portion of the wafer. In further embodiments, the sensors include: a first plurality of sensors operable to monitor energy from the first plurality of radiant heating elements; a second plurality of sensors operable to monitor energy from the second plurality of radiant heating elements; a third plurality of sensors operable to monitor energy from the third plurality of radiant heating elements; and a fourth plurality of sensors operable to monitor energy from the fourth plurality of radiant heating elements. In certain embodiments, the second plurality of sensors circumscribe the first plurality of sensors, and the fourth plurality of sensors circumscribe the third plurality of sensors. In some embodiments, the first and second plurality of sensors are located at a first distance less than about 30 cm from the first and second plurality of radiant heating elements, and the third and fourth plurality of sensors are located at a second distance less than about 30 cm from the third and fourth plurality of radiant heating elements. In various embodiments, the radiant heating elements are halogen lamps. In certain embodiments, the sensors are thermocouples.

Also provided is a wafer processing system. The exemplary wafer processing system includes a wafer processing chamber, a plurality of top and bottom radiant heating elements, and a plurality of top and bottom sensors. The system further includes at least one system coupled to the wafer processing chamber and operable to perform at least wafer processing process on a wafer located within the wafer processing chamber. The system includes a calibration module operable to characterize the plurality of top and bottom radiant heating elements by utilizing measurements produced by the plurality of top and bottom sensors during a wafer processing process performed by the at least one system and to provide a calibration for the plurality of top and bottom radiant heating elements based on the characterization.

In some embodiments, the plurality of top radiant heating elements are disposed in a center top zone and in an edge top zone; and the plurality of bottom radiant heating elements are disposed in a center bottom zone and in an edge bottom zone. In various embodiments, the plurality of top sensors are disposed in the center top zone and in the edge top zone, and the plurality of bottom sensors are disposed in the center bottom zone and in the edge bottom zone. In certain embodiments, the plurality of top radiant heating elements disposed in the edge top zone circumscribe the plurality of top radiant heating elements disposed in the center top zone, and the plurality of bottom radiant heating elements disposed in the edge bottom zone circumscribe the plurality of bottom radiant heating elements disposed in the center bottom zone. In some embodiments, the plurality of top sensors disposed in the center top zone are operable to measure a temperature in the center top zone, the plurality of top sensors disposed in the edge top zone are operable to measure a temperature in the edge top zone, the plurality of bottom sensors disposed in the center bottom region are operable to measure a temperature in the center bottom region, and the plurality of bottom sensors disposed in the edge bottom zone are operable to measure a temperature in the edge bottom zone.

Also provided is a method. The exemplary method includes providing a wafer processing chamber. The method further includes providing a plurality of radiant heating elements disposed in different zones outside the wafer processing chamber and operable to heat different portions of a production wafer disposed within the wafer processing chamber during a wafer processing process. The method further includes providing a plurality of sensors disposed in the different zones outside the wafer processing chamber and operable to monitor heat produced by the radiant heating elements during the wafer processing process. The method further includes performing a real-time calibration process that characterizes response change of the radiant heating elements to thereby maintain a substantially uniform temperature profile across a surface of the production wafer disposed within the wafer processing chamber.

In some embodiments, the method further includes before performing the real-time calibration process, performing an initial base calibration process thereby initially characterizing the radiant heating elements to thereby achieve a substantially uniform temperature profile across a surface of a test wafer disposed within the wafer processing chamber.

In some embodiments, performing the real-time calibration process includes: using the plurality of sensors to monitor heat produced by the plurality of radiant heating elements during the wafer processing process; characterizing the plurality of radiant heating elements, the characterizing including determining a response change of the plurality of radiant heating elements over time; and providing a real-time calibration based on the characterizing of the plurality of radiant heating elements. In various embodiments, performing the initial base calibration process includes: using the plurality of sensors to monitor heat produced by the plurality of radiant heating elements during a test wafer processing process; characterizing the plurality of radiant heating elements, the characterizing including determining an initial response of the plurality of radiant heating elements; and providing a base calibration based on the characterizing of the plurality of radiant heating elements. In certain embodiments, performing the initial base calibration process includes providing a base calibration that affects the power provided to the plurality of radiant heating elements disposed in the different zones, and performing the real-time calibration process includes modifying the base calibration that affects the power provided to the plurality of radiant heating elements disposed in the different zones without taking the wafer processing chamber in an offline state. In further embodiments, the base calibration includes base calibration parameter values represented as a percentage power ratio for each zone of the different zones. In some embodiments, the wafer processing process includes a process selected from the group consisting of chemical vapor deposition (CVD), rapid thermal processing (RTP), annealing, and etching.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a wafer processing chamber;
   radiant heating elements disposed in different zones and operable to heat different portions of a wafer located within the wafer processing chamber;
   sensors disposed outside the wafer processing chamber between the wafer processing chamber and the radiant heating elements and facing the radiant heating elements the sensors being operable to monitor energy from the radiant heating elements disposed in the different zones; and
   a computer configured to utilize the sensors to characterize the radiant heating elements disposed in the different zones and to provide a calibration for the radiant heating elements disposed in the different zones such that a substantially uniform temperature profile is maintained across a surface of the wafer.

2. The apparatus of claim 1 wherein the different zones of the radiant heating elements are four different zones, and
   wherein the sensors are disposed in four different zones corresponding to the four different zones of the radiant heating elements.

3. The apparatus of claim 1 wherein the radiant heating elements include:
   a first plurality of radiant heating elements disposed above the wafer in a first zone and operable to heat an inner portion of the wafer;
   a second plurality of radiant heating elements disposed above the wafer in a second zone and operable to heat an outer portion of the wafer;
   a third plurality of radiant heating elements disposed below the wafer in a third zone and operable to heat an inner portion of the wafer; and
   a fourth plurality of radiant heating elements disposed below the wafer in a fourth zone and operable to heat an outer portion of the wafer.

4. The apparatus of claim 3 wherein the sensors include:
   a first plurality of sensors operable to monitor energy from the first plurality of radiant heating elements;
   a second plurality of sensors operable to monitor energy from the second plurality of radiant heating elements;
   a third plurality of sensors operable to monitor energy from the third plurality of radiant heating elements; and
   a fourth plurality of sensors operable to monitor energy from the fourth plurality of radiant heating elements.

5. The apparatus of claim 4 wherein the second plurality of sensors circumscribe the first plurality of sensors, and
   wherein the fourth plurality of sensors circumscribe the third plurality of sensors.

6. The apparatus of claim 4 wherein the first and second plurality of sensors are located at a first distance less than about 30 cm from the first and second plurality of radiant heating elements, and
wherein the third and fourth plurality of sensors are located at a second distance less than about 30 cm from the third and fourth plurality of radiant heating elements.

7. The apparatus of claim 1 wherein the radiant heating elements are halogen lamps.

8. The apparatus of claim 1 wherein the sensors are thermocouples.

9. A wafer processing system, comprising:
a wafer processing chamber;
a plurality of top and bottom radiant heating elements operable to heat different portions of a wafer located within the wafer processing chamber;
a plurality of top sensors facing the plurality of top radiant heating elements and situated between the wafer processing chamber and the plurality of top radiant heating elements, and a plurality of bottom sensors facing the plurality of bottom radiant heating elements and situated between the wafer processing chamber and the plurality of bottom radiant heating elements, the plurality of top and bottom sensors operable to monitor energy from the plurality of top and bottom radiant heating elements;
at least one system coupled to the wafer processing chamber and operable to perform at least wafer processing process on the wafer located within the wafer processing chamber; and
a calibration module operable to characterize the plurality of top and bottom radiant heating elements by utilizing measurements produced by the plurality of top and bottom sensors during a wafer processing process performed by the at least one system and to provide a calibration for the plurality of top and bottom radiant heating elements based on the characterization.

10. The system of claim 9 wherein the plurality of top radiant heating elements are disposed in a center top zone and in an edge top zone, and
wherein the plurality of bottom radiant heating elements are disposed in a center bottom zone and in an edge bottom zone.

11. The system of claim 10 wherein the plurality of top sensors are disposed in the center top zone and in the edge top zone, and
wherein the plurality of bottom sensors are disposed in the center bottom zone and in the edge bottom zone.

12. The system of claim 10 wherein the plurality of top radiant heating elements disposed in the edge top zone circumscribe the plurality of top radiant heating elements disposed in the center top zone, and
wherein the plurality of bottom radiant heating elements disposed in the edge bottom zone circumscribe the plurality of bottom radiant heating elements disposed in the center bottom zone.

13. The system of claim 11 wherein the plurality of top sensors disposed in the center top zone are operable to measure a temperature in the center top zone;
wherein the plurality of top sensors disposed in the edge top zone are operable to measure a temperature in the edge top zone,
wherein the plurality of bottom sensors disposed in the center bottom region are operable to measure a temperature in the center bottom region, and
wherein the plurality of bottom sensors disposed in the edge bottom zone are operable to measure a temperature in the edge bottom zone.

14. A system comprising:
a wafer processing chamber;
a plurality of radiant heating elements disposed in different zones outside the wafer processing chamber and operable to heat different portions of a production wafer disposed within the wafer processing chamber during a wafer processing process;
a plurality of sensors disposed in the different zones outside the wafer processing chamber between the wafer processing chamber and the plurality of radiant heating elements and facing the plurality of radiant heating elements, the plurality of sensors being operable to monitor heat produced by the radiant heating elements during the wafer processing process; and
a control system programmed to perform a real-time calibration process that characterizes response change of the radiant heating elements to thereby maintain a substantially uniform temperature profile across a surface of the production wafer disposed within the wafer processing chamber.

15. The system of claim 14 wherein the control system is further programmed to perform:
a base calibration process to characterize the radiant heating elements to thereby achieve a substantially uniform temperature profile across a surface of a test wafer disposed within the wafer processing chamber.

16. The system of claim 14 wherein the real-time calibration process includes instructions for:
using the plurality of sensors to monitor heat produced by the plurality of radiant heating elements during the wafer processing process;
characterizing the plurality of radiant heating elements, the characterizing including determining a response change of the plurality of radiant heating elements over time; and
providing a real-time calibration based on the characterizing of the plurality of radiant heating elements.

17. The system of claim 15 wherein the base calibration process includes instructions for:
using the plurality of sensors to monitor heat produced by the plurality of radiant heating elements during a test wafer processing process;
characterizing the plurality of radiant heating elements, the characterizing including determining an initial response of the plurality of radiant heating elements; and
providing a base calibration based on the characterizing of the plurality of radiant heating elements.

18. The system of claim 15 wherein the base calibration process includes instructions for:
providing a base calibration that affects the power provided to the plurality of radiant heating elements disposed in the different zones, and
wherein the real-time calibration process includes instructions for modifying the base calibration that affects the power provided to the plurality of radiant heating elements disposed in the different zones without taking the wafer processing chamber in an offline state.

19. The system of claim 15 wherein the base calibration includes base calibration parameter values represented as a percentage power ratio for each zone of the different zones.

20. The system of claim 16 wherein the wafer processing process includes a process selected from the group consisting of chemical vapor deposition (CVD), rapid thermal processing (RTP), annealing, doping, and etching.

* * * * *